United States Patent [19]
Feldman et al.

[11] Patent Number: 5,610,733
[45] Date of Patent: Mar. 11, 1997

[54] BEAM-HOMOGENIZER

[75] Inventors: Michael R. Feldman, Charlotte, N.C.; John R. Rowlette, Sr., Hummelstown, Pa.

[73] Assignees: Digital Optics Corporation, Charlotte, N.C.; The Whitaker Corporation, Wilmington, Del.

[21] Appl. No.: 203,188

[22] Filed: Feb. 28, 1994

[51] Int. Cl.$^6$ .................................................. G03H 1/08
[52] U.S. Cl. ................................ 359/9; 359/15; 359/20; 359/25; 359/900
[58] Field of Search .................................. 359/15, 20, 22, 359/9, 569, 25, 16, 900

[56] References Cited

U.S. PATENT DOCUMENTS

| | | | |
|---|---|---|---|
| 4,170,396 | 10/1979 | Kraft | 359/15 |
| 4,410,237 | 10/1983 | Veldkamp | 359/569 |
| 4,455,061 | 6/1984 | Case | 359/17 |
| 4,547,037 | 10/1985 | Case | 350/3.75 |
| 4,682,841 | 7/1987 | Afian et al. | 359/15 |
| 4,979,791 | 12/1990 | Bowen et al. | 385/33 |
| 5,061,025 | 10/1991 | Debesis | 359/569 |
| 5,075,800 | 12/1991 | Hasman et al. | 359/569 |
| 5,117,476 | 5/1992 | Yingst et al. | 385/88 |
| 5,202,775 | 4/1993 | Feldman et al. | 359/11 |
| 5,289,298 | 2/1994 | Smith | 359/14 |
| 5,315,427 | 5/1994 | Rauch et al. | 359/569 |
| 5,361,149 | 11/1994 | Hasegawa et al. | 359/16 |

OTHER PUBLICATIONS

J. Cederquist, et al., "Computer–Generated Holograms for Geometric Transformations", *Applied Optics*, vol. 23, No. 18, Sep. 1984, pp. 3099–3104.

Y. H. Wu, et al., "Cell–Oriented On–Axis Computer–Generated Holograms for use in the Fresnel Diffraction Mode" *Applied Optics*, vol. 23, No. 2 15 Jan. 1984.

M. A. Golub, et al., "Focusing Light into a Specified Volume by Computer–Synthesized Holograms" Sov. Tech. Phys. Lett. 7(5) May 1981.

Iterative encoding of high–efficiency holograms for generation of spot arrays–Michael R. Feldman and Clark C. Guest—*Optics Letters*/vol. 14, No. 10/May 15, 1989—pp. 479–481.

Holographic optics: for when less is more—Sunny Bains—*Laser Focus World*, Apr. 1993–pp. 151–156.

*Primary Examiner*—Paul M. Dzierzynski
*Assistant Examiner*—John Juba, Jr.
*Attorney, Agent, or Firm*—Petree Stockton, LLP

[57] ABSTRACT

A beam homogenizer for converting an incident beam of non-uniform spatial power or energy distribution into an output beam of uniform spatial power or energy distribution. The homogenizer is a holographic optical element constructed from an array of facets or subholograms and positioned at a first plane in the path of an incident signal. The transmittance from each subhologram is uniformly spread across a target at a second plane that is spaced away from the first plane Another optical element, such as a holographic collimation element, may be placed at the second plane to collimate the transmittances thereupon.

10 Claims, 3 Drawing Sheets

BEAM-HOMOGENIZER

FIELD OF THE INVENTION

The invention relates generally to an optical apparatus, and pertains more specifically to a system for producing an output beam having a uniform spatial distribution of power or energy.

BACKGROUND OF THE INVENTION

A laser device generally produces a beam of coherent light that has a wavefront of relatively small cross-section. In spite of the small cross-section and the coherency of the beam, the wavefront of a laser typically has a nonuniform spatial power or energy distribution that is stronger in the center than at the outer edges. Furthermore, to make use of the beam, it is often necessary to expand the cross-sectional area of the beam, thereby spreading the non-uniformity across a larger wavefront.

When conventional lenses are used to expand the beam, the non-uniform spatial power or energy distribution of the wavefront is carried through to the expanded beam. In addition, the non-uniformity of the beam becomes more apparent as the wavefront is now expanded over a greater cross-sectional area. This non-uniformity is often detrimental to the performance of a system utilizing the beam as the system must be designed for some average level of beam power or energy or another approach would be to somehow strip the beam of its lesser power outer portions, possibly through the use of an aperture. Neither of these alternatives enable optimum use of the beam's power or energy and it is very difficult to achieve a uniform power or energy distribution, such as the plus or minus one percent variation that is often desired, by way of conventional lens systems.

Holographic elements have been created to function as conventional bulk optical elements. In these cases, the holographic element, whose orientations and spatial periods are correct for the purpose of diffracting the incident wavefront into a desired output location pattern, shape or image. However, when built to function as a basic lens, these holographic elements would also carry the nonuniform spatial power or energy distribution through to the output pattern, shape or image, thereby also inefficiently using the power or energy of the optical source.

The problem of how to compensate for wavefronts having a nonuniform power distribution is addressed U.S. Pat. No. 4,547,037. This patent discloses a multi-faceted holographic element which redistributes the light energy of an incident beam onto a second plane disclosed. This is accomplished by constructing each facet as an individual hologram or diffraction grating. Each facet is sized to be inversely proportional to the intensity of the portion of the beam incident thereupon to assure that substantially the same amount of power passes through each facet. The light transmitted through each facet is diffracted to arrive at different locations on a second plane, relative to their locations in the holographic element. Each of the subholograms or diffraction gratings either expand or contract the portion of the incident beam passing therethrough to illuminate equal, but different, areas on the second plane, thereby producing an output beam at the second plane with a wavefront of nearly constant intensity.

A problem with devices incorporating the teachings of the '037 patent is that if the power distribution of the incident beam upon the surface of the hologram deviates from the design parameters, then the power distribution of the output beam at the second plane will be similarly affected and thus no longer uniform. In optical systems, there are many causes for such deviation in the power distribution of the incident beam could occur. For example, power fluctuations due to the age of the components, or simply the replacement of the source due to failure. In addition, any misalignment within the system due to shock or age will produce an output wavefront having a non-uniform spatial power distribution.

What is needed is an relatively inexpensive way to convert an incident optical beam having a wavefront with a non-uniform spatial power or energy distribution to an output beam having a substantially uniform spatial power or energy distribution that is relatively insensitive to fluctuations in positioning of the incident beam and spatial power or energy distributions within the incident beam. Such a system would function properly with either a continuous wave or pulsed laser as a light source.

SUMMARY OF THE INVENTION

The invention is a beam homogenizer for converting an incident beam having a non-uniform spatial power or energy distribution into an output beam of uniform spatial power or energy distribution. The incident beam is incident upon the beam homogenizer, formed as an array of facets where each facet is constructed to transmit any portion of the incident beam incident thereupon to an output plane spaced from the beam homogenizer so that the light transmitted through each of the facets overlap at the output plane to form the output beam which now has a substantially uniform spatial power or energy distribution.

It is an object of this invention to convert an incident optical beam having a non-uniform spatial power or energy distribution to an output beam having uniform spatial power or energy distribution at an output plane.

It is a feature of this invention that the optical beam having a non-uniform spatial power or energy distribution incident upon a homogenizer having an array of facets and the portion of the incident beam transmitted through each facet is imaged over an entire target on overlap at an output plane, thereby homogenizing the incident optical beam to produce an output beam of substantially uniform spatial power or energy distribution at the output plane. It is another feature of this invention that the homogenizer is a hologram and each of the facets are subholograms. It is yet another feature of this invention that the subholograms are designed to minimize interference effects at the output plane between the light transmitted through the facets.

It is an advantage of this invention that the homogenizer may be developed by computer generation techniques and may be fabricated relatively inexpensively. It is another advantage of this invention that the homogenization is relatively insensitive to fluctuations in the energy density of the incident beam. It is a further advantage of this invention that the uniform spatial power or energy distribution of the output beam is substantially insensitive to the location the incident beam falls on the homogenizer. It is a further advantage of this invention to effect the homogenization of either continuous wave or pulsed laser sources.

BRIEF DESCRIPTION OF THE DRAWINGS

The present invention will now be described by way of example with reference to the accompanying drawings in which:

FIG. 1 shows the spatial power or energy distribution of a beam incident upon a homogenizer of the present invention and how the portions of the incident beam that are transmitted through the homogenizer are constituted at an output plane to produce an output beam having a substantially uniform spatial power or energy distribution and a second collimating hologram that is used to collimate the output beam. This represents the input characteristic of an inert gas-halide laser, popularly known as an excimer laser.

DESCRIPTION OF THE PREFERRED EMBODIMENT

Figure 3:
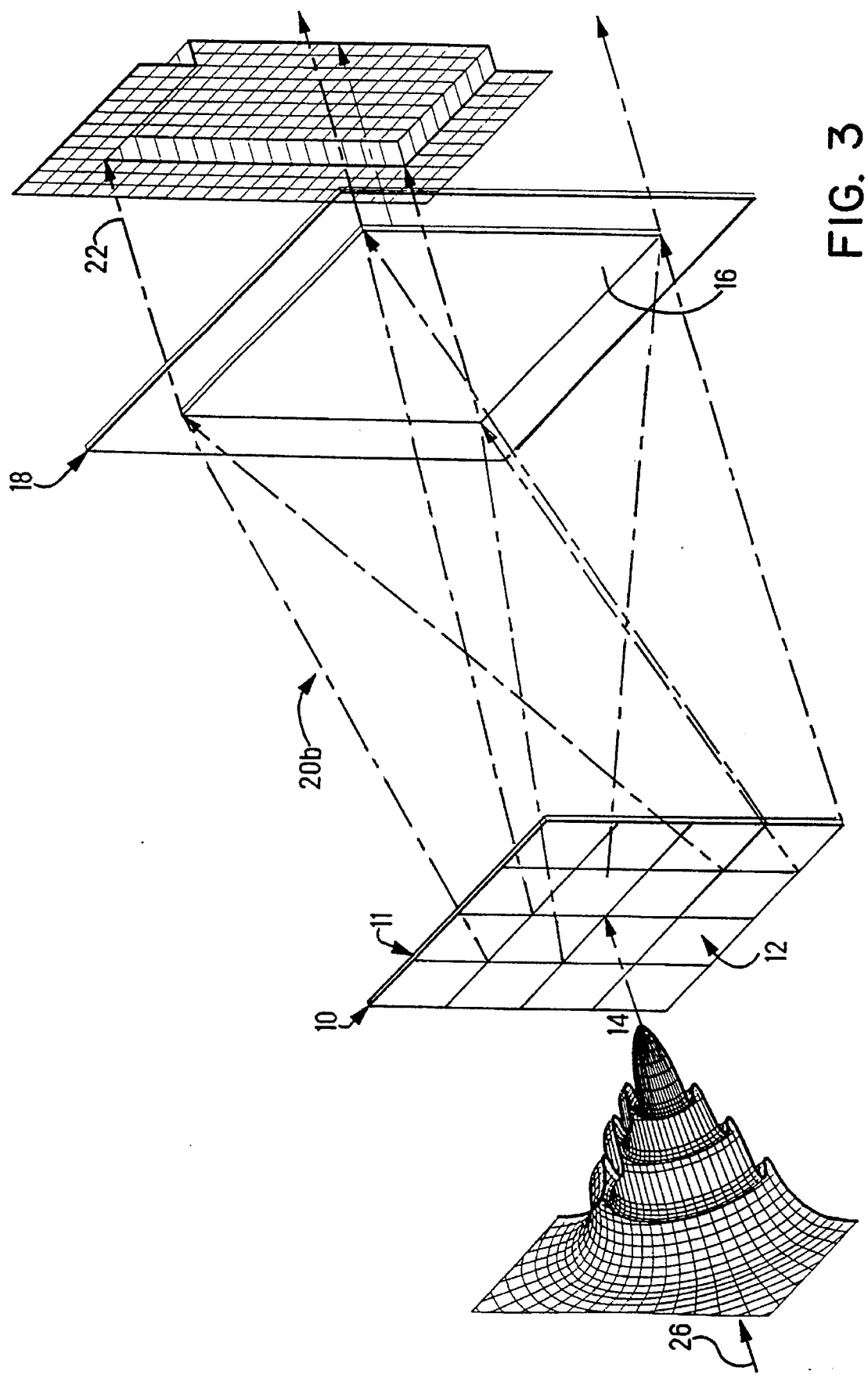
FIG. 3 shows yet another spatial power or energy distribution of an incident beam that is typical of a Nd:YAG laser with a stable resonator optics incident on a homogenizer and the resultant collimated output beam.

The present invention is shown in FIG. 1. An optical beam is incident on a homogenizer 10 having an array 11 facets 12. Each of these facets 12 is constructed to direct any portion of an incident optical beam 14 that is incident thereupon uniformly over an entire target 16 at an output plane 18. As the portion of the incident beam transmitted through each of the facets 12 (shown illustratively as 20a and 20b) overlap at the target 16, the incident optical beam is mixed, thereby homogenizing the discrete portions of the incident beam 14 that are transmitted through each facet 12. This homogenization assures that at the target 16 there is a uniform mix of the incident beam 14, such that at the output plane 18 the output beam 22 has a uniform spatial power or energy distribution 24. The homogenization process averages the spatial power or energy distribution of the incident beam 14 with some losses due to inefficiencies.

Figure 2:
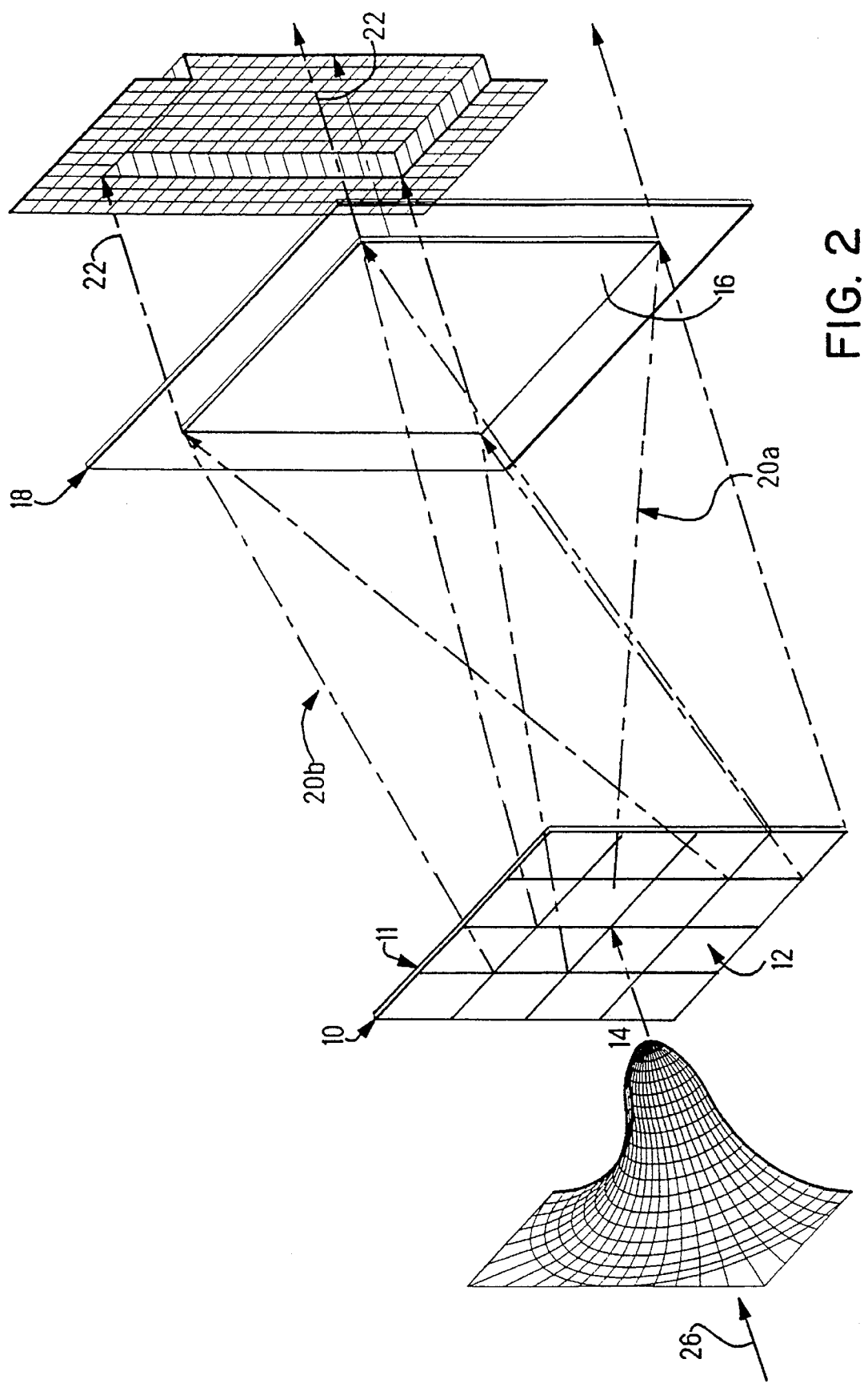
FIG. 2 shows the spatial power or energy distribution of an incident beam that is typical of a $CO_2$ or He-Ne laser incident on a homogenizer and the resulting collimated output beam.
Figure 3:
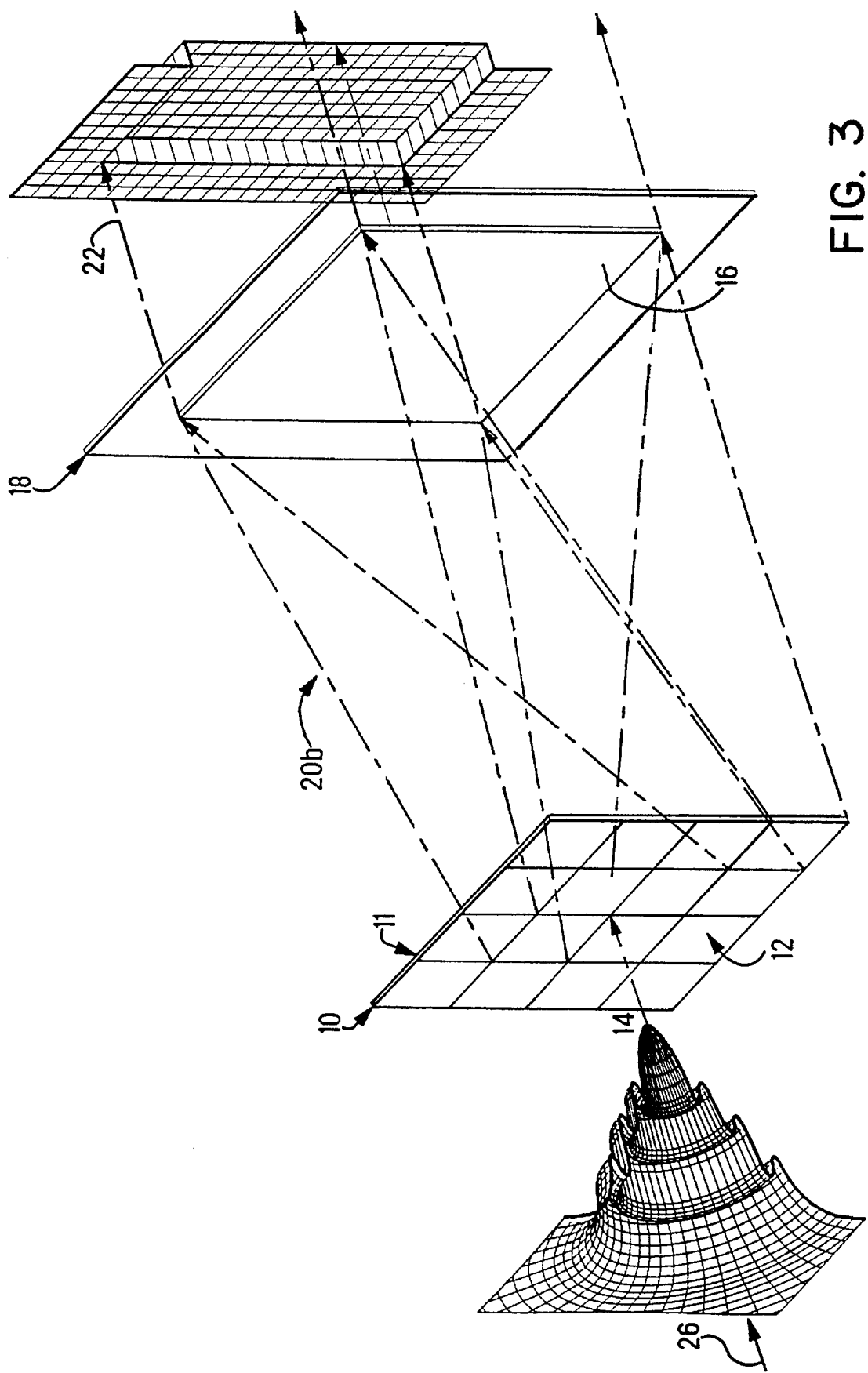

The incident optical beam 14 emanates from an optical source (not shown), such as a laser, and is preferably in a collimated state, the spatial power or energy distribution of the incident beam may take on various forms, some of which are illustrated in FIGS. 1–3. The incident optical beam 14 may be transferred to the homogenizer 10 from the optical source and collimated by way of conventional bulk optical elements, such as lenses and mirrors or through the use of holographic elements that produce the same results as conventional optical elements. Typically, the incident beam 14 has a spatial power or energy distribution 26 that may have a significant variation across its cross-section. In some sources the spatial power or energy distribution 26 could vary significantly. For example in a gaussian beam this variation is typically 1/e, or 64% of the peak value. In addition, as the optical source ages or the power supply driving the optical source fluctuates, the power or energy distribution 26 of the incident beam 14 may also change. The beam homogenizer 10 is constructed to blend the incident optical beam 14 so that at the target 16 of the output plane 18 the output beam 22 will have an essentially uniform spatial power or energy distribution 24, independent of any variation in the spatial power or energy distribution 26 of the incident beam 14 and regardless of slight variation in where the incident beam 14 falls on the array 11. The spatial power or energy distribution 24 at the target 16 will be essentially an average of the power or energy transmitted by each facet 12 rather than the power uniformity 26 of the incident signal 14.

The beam homogenizer 10 in this embodiment is a holographic element and the facets 12 are sub-holograms, shown in FIG. 1 as a M×N linear array of equal sized sub-holograms. It is also envisioned that the sub-holograms may be of different sizes. These sub-holograms 12 are constructed to diffract any portion of the incident optical beam 14 that is incident thereupon over the entire target 16 at the output plane 18. Each of these sub-holograms 12 is a distinct diffractive grating that will direct the portion of the incident beam 14 over the entire target 16. Due to the number of fringes or pixels, which would approach eighty lines per millimeter (80 lines/mm) for the sub-holograms 12 in the particular implementation described below, these fringes have been omitted from the drawing for the sake of clarity. In addition, the homogenizer 10 is shown as a four-by-four array 11 for clarity of illustration and ease of description, while in reality, as described below, there may be substantially more sub-holograms 12, or facets, making up the homogenizer 10.

There are two general methods of creating holograms. One way is by creating an interference pattern between coherent light beams on a holographic plate and then developing the plate. Interference holograms modulate the index of refraction of the medium to create the desired diffraction pattern when the reference beam illuminates the hologram. However, there are two major problems that must be addressed for a laser homogenizer to be fabricated. The first is that the absorption of the laser beam in the polymer must be low enough to not damage the polymer. The absorption is too high for most applications. In addition fabrication of volume holograms is difficult because the photosensitivity of the polymers is limited to a relatively narrow wavelength range, typically in the 450 to 700 nm range. The wavelength of the laser the output of which is to be reconstructed must be used to create the holograms unless some complicated and costly techniques are employed. This severely limits the wavelength of laser that can be used, and particularly eliminates the more practical laser sources such as $CO_2$, Nd:YAG and Eximer lasers. In computer generated holograms the material can be made of silicon, fused silica or quartz. These have low absorptivity and high damage thresholds for lasers in appropriate wavelength regions. In addition, the wavelength that the laser is to operate is a part of the computer generated hologram design and can easily handle from the UV region to the far infrared.

In order to overcome the design and fabrication problems associated with interference based holograms, Computer Generated Holograms (CGH) have been developed. CGH's may be developed by calculating the desired holographic pattern and then, based upon the given construction conditions, mathematically working backwards from that pattern, or reconstructed wavefront, to the particular hologram required. Several iterative CGH encoding methods have been developed to take advantage of the increased performance of computers to develop CGHs with significantly higher performance than holograms developed using other mathematical techniques.

CGHs are usually surface-relief in nature and CGHs are formed using photolithographic, etching, electron-beam writing or other techniques. The electron-beam technology provides resolution close to that of optical film, but contains amplitude and phase quantization levels that are much coarser. Photolithographic procedures can provide multi-level holograms; however, alignment error between the layers increases with the number of layers.

Note that the major difference between the present invention and that of U.S. Pat. No. 4,547,037 is that in the latter the light illuminating each facet is directed to a different location in the output plane. On the other hand, in the present invention light from many facets will overlap in the output plane. While the advantages of this feature were explained earlier, the disadvantage of this feature is that in locations in the output plane where light from several facets overlap, coherence effects can cause interference patterns to arise that could cause large fluctuations in the laser intensity profile, if the holograms are not specifically designed to avoid this problem. For example, if the subhologram were designed independently, and the size of each subhologram was made smaller than the spatial coherence width of the laser source, then the coherence effects could cause large bright and dark fringe patterns in locations where the light from several facets overlap.

This problem can be avoided by designing the subholograms with an iterative encoding method such as Iterative Discrete On-axis (IDO) encoding. This method is more fully described in the publication entitled *Iterative Encoding of High-Efficiency Holograms for Generation of Spot Arrays*, Optics Letters, Vol. 14, pp. 479–81, 1989 by co-inventor Feldman et al. the disclosure of which is hereby incorporated by reference. Briefly, the hologram is divided into a two-dimensional array of rectangular cells and transmittance values for each cell is chosen and then optimized until an acceptable image is obtained. During the optimization process, the image, including interference effects between different facets, is monitored. The transmittance values for each cell is chosen to not only spread the light illuminating each facet over a large portion of (or the entire) output plane, but also to minimize the interference effects among the facets. Since on-axis encoding does not require a carrier wavefront for the hologram to function, these holograms can produce CGH's with much higher diffraction efficiencies than off-axis methods which do require a carrier wavefront. This is because holograms have a practical upper limit to the available Space-Bandwidth Product (SBP), or information contained in the CGH, that can be used to encode the desired image. When no information is required for a carrier wavefront, more information may be encoded relative to the desired image. It may also be desirable to use the encoding method described in U.S. Pat. No. 5,202,775 titled *Radially Symmetric Hologram and Method of Fabricating the Same* which is also incorporated herein by reference. One unusual characteristic of iterative encoding methods such s IDO and RSIDO is that of "phase skipping." Phase skipping, described also in U.S. Pat. No. 5,202,775 occurs when two adjacent CGH pixels have phase levels that differ by more than one phase level but less than by N-1 phase levels. Note that phase skipping does not occur when binary or multi-level gratings are employed such as those described in U.S. Pat. No. 4,547,037.

In applying the IDO method to the design of each sub-hologram 12, it is important to keep the diffraction angles small so that a high efficiency CGH, with physically realizable features, can be developed based on the short wavelength of the incident optical beam 14. For this particular example, the incident optical beam 14 is assumed to have an elliptical form of 2.5 cm by 1 cm (centimeter) with a wavelength of 308 nm±1 nm (nanometer). The target 16, or output beam 22, could take on a number of shapes including circular or square and in particular in this described example the diameter at the output plane 18 is selected to be 1.5 cm. Under these conditions, the maximum deflection angle of the beam homogenizer 10 will be 2.9° if the spacing between homogenizer 10 and the target 16 on the output plane 18 is 20 cm.

With the maximum CGH deflection angle being 2.9°, a maximum spatial frequency of 160 lp/mm (line-pairs/millimeter) is required. In order to have an economical use of the optical power of the source, in this case a laser (not shown), the CGHs that make up the homogenizer must have high diffraction efficiency. A diffraction efficiency of approximately 80% to 90% would be obtainable if the CGH spatial frequency is 800 lp/mm, or approximately five times the maximum spatial frequency required. The CGH spatial frequency of 800 lp/mm corresponds to a CGH minimum feature size of 0.6 µm (micrometer)

A further requirement to enable the CGH to have the high efficiency needed for economical use of the power of the incident beam is that the SAP (Space Bandwidth Product) of each sub-hologram be greater than or equal to 128×128. SAP is the number of pixels in the subhologram. It is also a measure of degrees of freedom. In general, a large number of degrees of freedom are needed to implement arbitrary optical functions with high efficiencies. This places a lower boundary on the dimensions of each of the subholograms of 77 µm×77 µm. With the dimensions of each subhologram set to 100 µm×100 µMa a 100×100 facet array is of sufficient size to be used with the beam of the present example. These particular parameters yield a SAP of 167×167 well above the projected minimum SAP of 128×128 required for a diffraction efficiency between 80–90%. The calculated final diffraction efficiency for this device is projected to be between 85% and 95%.

The transmittance 20a, 20b of each sub-hologram 12 will cover the entire target 16 at the output plane 18 and form the homogenized output beam 22. It is anticipated that the output beam 22 diameter will be 1.5 cm×1.5 cm. In this case the output beam 22 is of a smaller diameter than the input beam 14. It would also be possible for the output beam 22 to be expanded by the homogenizer 10 such that the target 16 will have a larger cross-section than the input beam 14 or any arbitrary profile desired.

The output plane 18 represents an area in space rather than any particular element. It would be possible to place a bulk optical element, an optical fiber, another hologram, such as the collimating hologram shown in FIG. 1, an active device or any other apparatus that would make use of the output beam, such as a blocking mask or an object to be illuminated. One such application would be to incorporate an optical element, such as the collimating hologram 28 shown in the FIG. 1, at the output plane 18 that would enable the output beam to be used in laser cutting machines. In the absence of the homogenizer 10, a beam used in laser cutting applications has the intensity distribution of the incident beam 24 or a significant amount of the power or energy of the incident beam will be lost by passing the beam through an aperture. As shown in FIG. 1, the wavefront of the incident beam has a higher power center section, or "hotspot", that will cut through material faster than the lesser power outer fringe section. This makes for less accurately cut edges since the edge would take on a shape that approximates the reciprocal of the wavefront of the incident beam power distribution. The power distribution of the output wavefront at the target illustrates the crisp power difference between off-target and on-target intensities of the homogenized beam. With the homogenized intensity distribution of the homogenized beam, cutting occurs more uniformly across the output beam to produce a more accurate edge.

Changes in construction will occur to those skilled in the art and various apparently different modifications and embodiments may be made without departing form the scope of the invention. The material set forth in the foregoing description and accompanying drawing is offered by way of illustration only. It is therefor intended that the forgoing description be regarded as illustrative rather than limiting and that the invention be only limited by the scope of the claims.

We claim:

1. A beam homogenizer for converting an input beam having an nonuniform spatial energy distribution into an output beam having a substantially uniform spatial energy distribution at an output plane, the beam homogenizer comprising:

an array of facets, the input beam illuminating at least some of the facets, and each thusly illuminated facet transmitting a majority of the portion of the input beam incident thereupon so that at a target located at the output plane, the majority of the portion of the input beam transmitted through each of said illuminated facets overlaps the portion of the input beam transmitted through at least one other illuminated facet, whereby the energy of the incident beam is spatially redistributed at the output plane into a homogenized output beam having a uniform spatial energy distribution at the output plane, and wherein the facets are computer generated holograms, relatively insensitive to fluctuations in positioning of the input beam for incidence thereupon and to spatial energy distributions within the input beam.

2. The beam homogenizer of claim 1, wherein the array is a M×N linear array of facets.

3. The beam homogenizer of claim 1, wherein all of the facets are the same size.

4. The beam homogenizer of claim 1, wherein the size of each facet is determined independently of the light intensity to be incident thereupon.

5. The beam homogenizer of claim 1, wherein each illuminated facet expands the portion of the input beam thereupon onto the target at the output plane.

6. A beam homogenizer system for converting an input beam having a nonuniform energy distribution into an output beam having a substantially uniform spatial energy distribution at a second plane spaced from the homogenizer, the beam homogenizer comprising:

an array of computer generated sub-holograms, the input beam illuminating at least some of the computer generated sub-holograms;

each computer generated sub-hologram having a size which is determined independently of the intensity of the portion of the input beam incident thereupon, and being relatively insensitive to fluctuations in positioning of the input beam for incidence thereupon;

each computer generated sub-hologram diffracting a majority of the portion of the input beam incident thereupon so that at a target located at the second plane, the portion of the input beam diffracted by each of the illuminated computer generated sub-holograms overlaps the portion diffracted by at least one other illuminated computer generated sub-hologram to form said output beam, whereby the intensity of the output beam is substantially equalized over the entire target, and wherein the target is substantially larger than each computer generated sub-hologram.

7. The beam homogenizer of claim 6 wherein a holographic optical element is included at the target to collimate the output beam incident thereupon.

8. A method of homogenizing an input beam having a nonuniform spatial energy distribution at a first plane into an output beam with a uniform spatial energy distribution at a second plane, the method comprising the steps of:

providing a holographic optical element comprising an array of computer generated sub-holograms;

fixedly positioning said holographic optical element at the first plane so that the input beam illuminates at least some of the computer generated sub-holograms, each illuminated computer generated sub-hologram expansively diffracting the portion of the input beam incident thereupon over an entire target at the second plane to superimpose the diffracted portions of all of the illuminated computer generated sub-holograms to form the output beam at the second plane, wherein the step of providing the holographic element includes generating an array of sub-holograms that is relatively insensitive to fluctuations in positioning of an input beam for incidence on said array and to spatial energy distributions within the incident beam.

9. A beam homogenizer system for converting an incident beam having a nonuniform spatial energy distribution into an output beam having a substantially uniform spatial energy distribution at an output plane spaced from the homogenizer, the homogenizer comprising:

an array of sub-holograms designed with an iterative encoding method such that portions of said incident beam diffracted by several of said sub-holograms overlap at the output plane, whereby said output beam has a substantially uniform spatial energy distribution that is relatively insensitive to fluctuations in positioning of an input beam for incidence on said homogenizer and to spatial energy distributions within the incident beam.

10. A beam homogenizer system for converting an incident beam having a nonuniform spatial energy distribution into an output beam having a substantially uniform spatial energy distribution at an output plane spaced from the homogenizer, the homogenizer comprising:

an array of sub-holograms, each of said sub-holograms containing pixels that exhibit phase skipping and the light diffracted by at least two of the sub-holograms overlap in the output plane, whereby said output beam has a substantially uniform spatial energy distribution that is relatively insensitive to fluctuations in positioning of an input beam for incidence on said homogenizer and spatial energy distributions within the incident beam.

* * * * *